United States Patent [19]

Raghavachari

[11] Patent Number: 5,386,383
[45] Date of Patent: Jan. 31, 1995

[54] METHOD AND APPARATUS FOR CONTROLLING DYNAMIC RANDOM ACCESS MEMORY DEVICES

[75] Inventor: Partha Raghavachari, Chicago, Ill.

[73] Assignee: AT&T Corp., Murray Hill, N.J.

[21] Appl. No.: 203,209

[22] Filed: Feb. 28, 1994

[51] Int. Cl.[6] ............................................. G11C 13/00
[52] U.S. Cl. ............................ 365/189.05; 365/189.01; 365/201; 371/11.3
[58] Field of Search .............. 365/149, 189.01, 189.05; 371/21.2, 11.3, 10.3, 8.1

[56] References Cited

U.S. PATENT DOCUMENTS

| | | | |
|---|---|---|---|
| 4,533,843 | 8/1985 | McAlexander | 365/149 |
| 4,757,503 | 7/1988 | Hayes et al. | 371/21.1 |
| 4,916,700 | 4/1990 | Ito et al. | 371/21.1 |
| 4,980,888 | 12/1990 | Bruce et al. | 371/21.1 |
| 5,016,220 | 5/1991 | Yamagata | 371/21.1 |
| 5,228,045 | 7/1993 | Chiles | 371/22.3 |
| 5,231,605 | 7/1993 | Lee | 371/21.1 |

FOREIGN PATENT DOCUMENTS

| | | |
|---|---|---|
| 0291283 | 11/1988 | European Pat. Off. |
| 0293884 | 12/1988 | European Pat. Off. |
| 0327309 | 8/1989 | European Pat. Off. |
| 0382360 | 8/1990 | European Pat. Off. |
| 0411904 | 2/1991 | European Pat. Off. |
| 2204721 | 11/1988 | United Kingdom |
| 2228112 | 8/1990 | United Kingdom |

OTHER PUBLICATIONS

P. Raghavachari, "Circuit Pack BIST from System to Factory-the MCERT Chip," IEEE Proceedings of the International Test Conference 1991, pp. 641–648.
S. N. Chau and D. A. Rennels, "Self-Testing Computer Memory," NASA Tech Briefs, Apr. 1989, Washington DC, US, pp. 249–250.
Katsuji Hosoda, "Integrated MOS Memory Circuit Element," Patent Abstracts of Japan, vol. 8, No. 125, pp. 279, 1562, Jun. 12, 1984.
M. Y. Hsiao, "A Class of Optimal Minimum Odd-Weight-Column SEC–DED Codes," IBM J. Res. Develop., 395–401 (Jul. 1970).

Primary Examiner—Terrell W. Fears
Attorney, Agent, or Firm—Robert B. Levy

[57] ABSTRACT

A memory system (30), comprised of a plurality of banks ($32_0$–$32_7$) of DRAM devices (10) is controlled by a memory controller (34) that not only determines the presence and density of the DRAM devices upon power-up, but also controls their addressing during normal operation. The memory controller addresses the DRAM devices in each bank by providing each with a complete row address and a complete column address that simultaneously specifies the row and column address for the condition when the DRAM device is symmetric and asymmetric. In this way, the controller can accommodate both symmetric and asymmetric DRAM devices in the same bank.

18 Claims, 6 Drawing Sheets

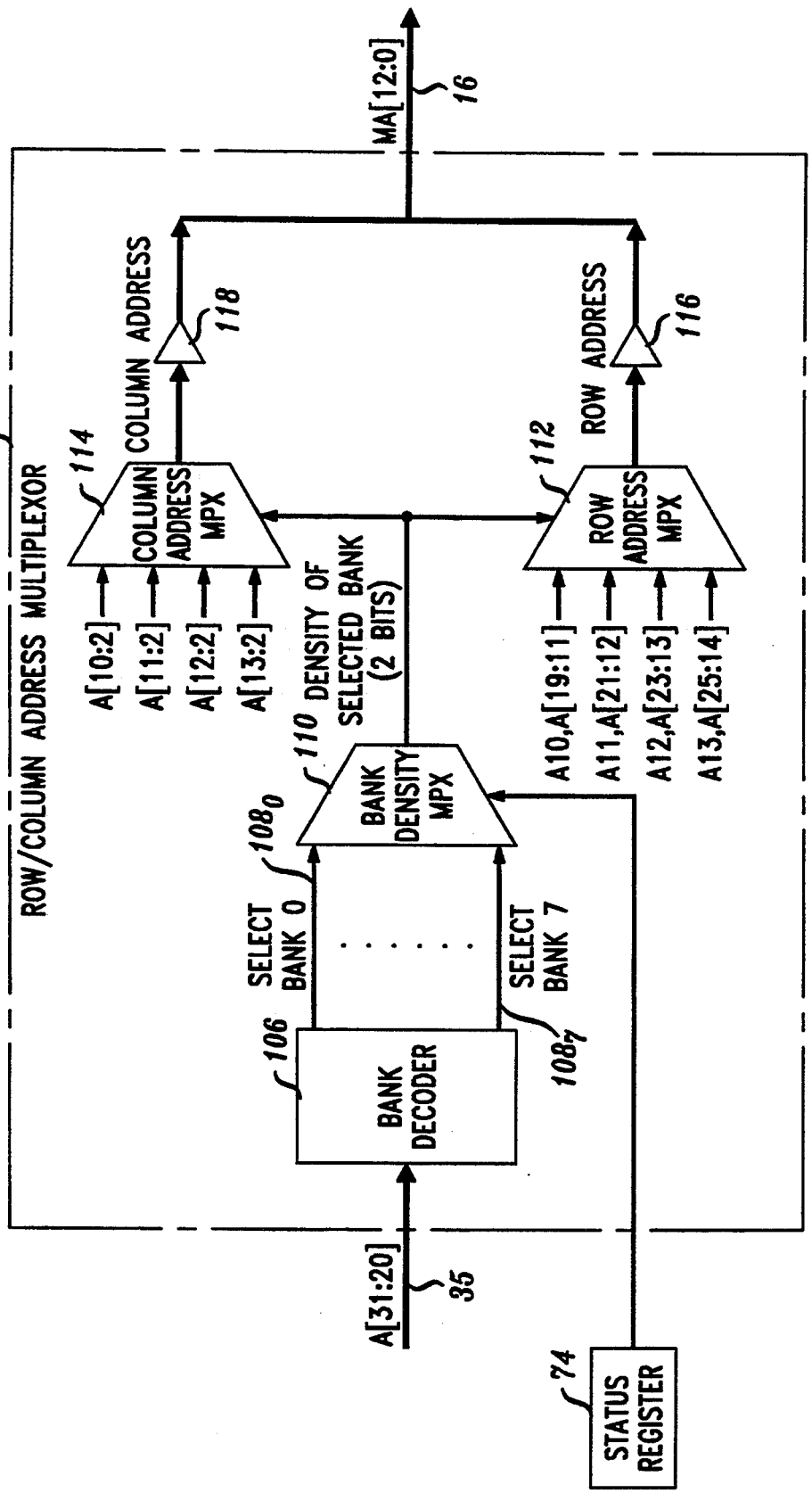

METHOD AND APPARATUS FOR CONTROLLING DYNAMIC RANDOM ACCESS MEMORY DEVICES

TECHNICAL FIELD

This invention relates to a technique for controlling a bank of Dynamic Random Access Memory (DRAM) devices to facilitate the addressing of each device.

BACKGROUND OF THE INVENTION

DRAM devices of the type used in computers and the like are typically each comprised of a matrix array of memory cells. The amount of information that can be stored within each DRAM device is dependent on both the number of memory cells in the matrix array and the number of bits that can be stored by each cell. In one type of DRAM device, each memory cell stores one bit of data while in another type of DRAM device, each cell stores four bits of data. A DRAM device that contains 16M separate cells (where M represents 1,048,576 bits), each cell storing one bit of information, is referred to as a 16M×1 device whereas a DRAM device containing 4M cells, each storing four bits, is referred to as a 4M×4 device.

Each memory cell within the DRAM device has a unique address that designates the location of that cell in the array. The number of addresses needed depends on the number of cells in the DRAM device. For example, a 4M×4 DRAM device requires 4M addresses, each address typically being represented by a twenty-two-bit binary word. Rather than provide the DRAM device with a separate address line for each bit in the binary address, most DRAM devices multiplex their address lines so as to have only as many lines as the largest row address or column address, depending on which is greater.

To locate a particular cell in the matrix array in a DRAM device having multiplexed address lines, a row address, specifying the row containing the memory cell of interest, is first placed on the address lines. The row address is decoded to select the corresponding row containing the specified cell. Thereafter, the address of the column containing the memory cell of interest is placed on the address lines. Similarly, the column address is decoded and the corresponding column containing the cell of interest is selected. The combination of the row address and column address completely specifies the location of each memory cell in the array. In the case of a 4M×4 DRAM device having a square array of memory cells (i.e., 2048 rows by 2048 columns), eleven binary bits am required to specify each row address and each column address, thus necessitating eleven address lines. A DRAM device having such a square array of memory cells is said to be symmetric.

Presently, DRAM devices having a density of 4M and greater are being fabricated with a rectangular rather than square array of memory cells, usually with more rows than columns. The benefit of arraying the memory cells in this manner is that the peak energy needed to refresh each row of cells is smaller, because each row has a smaller number of cells as compared to a symmetric DRAM device having the same number of cells. A DRAM device having a rectangular array of memory cells is said to be asymmetric. Unlike a symmetric DRAM device whose row and column addresses are of equal length, asymmetric DRAM devices require a larger row address and a smaller column address. Thus, in the case of a 4M×4 DRAM device having a matrix array of 4096 rows by 1024 columns of cells, twelve bits are required to specify the address of each row while only ten bits are required to specify each column address.

In systems that employ a plurality of DRAM devices, the task of addressing the cells in the DRAM devices is performed by a memory controller in response to a cell address provided by a processor or the like. Presently, the memory controllers employed to control banks of DRAM devices are designed to provide the proper row and column addresses for either an asymmetric or a symmetric DRAM device, but not both. Thus, it has not been possible to mix asymmetric and symmetric devices in the same memory bank.

The emergence of asymmetric DRAM devices, and their interchangeability with symmetric devices, makes it desirable to employ both types of devices in a memory bank. In particular, most symmetric and asymmetric DRAM devices of the same density have the same physical appearance so that differentiating between them is difficult. However, given the inability of present day controllers to address both symmetric and asymmetric DRAM devices, it is thus necessary to segregate such devices.

Thus, there is a need for a technique for controlling a memory bank containing asymmetric and/or symmetric DRAM devices.

SUMMARY OF THE INVENTION

Briefly, in accordance with the invention, a technique is disclosed for controlling a plurality of banks of DRAM devices, each DRAM device comprised of a plurality of memory cells arrayed in a matrix of rows and columns. The first step in controlling such a bank of DRAM devices is to decode an incoming address, specifying a cell of interest in each DRAM device in a bank, so as to designate the bank of DRAM devices each containing the cell of interest. Thereafter, the incoming address is multiplexed to generate a complete row address that specifies the row in each DRAM containing the cell of interest when the DRAM is asymmetric and that simultaneously specifies the row when the DRAM is symmetric. The incoming address is also multiplexed to generate a complete column address that specifies the column in each DRAM containing the cell of interest when the DRAM is symmetric and that simultaneously specifies the column when the DRAM is asymmetric.

Once generated, the complete row address value and then the complete column address value are applied to the designated DRAM device. Upon receipt, only as much of the complete row address value as is necessary to specify the row is decoded to select the row containing the cell to be accessed. Thereafter, only as much of the complete column address value as is necessary to specify the complete column is decoded to select the column containing the cell of interest. The portion of the complete row address value in excess of the required value needed to specify the row address for a symmetric DRAM device is ignored during decoding. Similarly, that portion of the complete column address value in excess of the required value needed to specify the column address for an asymmetric DRAM device is likewise ignored during decoding.

As may be appreciated, the above-described method allows for addressing of both asymmetric and symmetric DRAM devices in the same bank by providing each with a complete row and column address value sufficient to specify the row and column, respectively, containing the cell of interest. While a complete row and column address may contain spurious bits when the DRAM is symmetric and asymmetric, respectively, such spurious bits in each address value are ignored during decoding. Thus, regardless of the nature of the DRAM device, the cell of interest is always properly addressed.

BRIEF DESCRIPTION OF THE DRAWING

FIG. 7 is a block schematic diagram of a row address and column address multiplexor comprising an element of the memory controller of FIG. 4.

DETAILED DESCRIPTION

Figure 1:
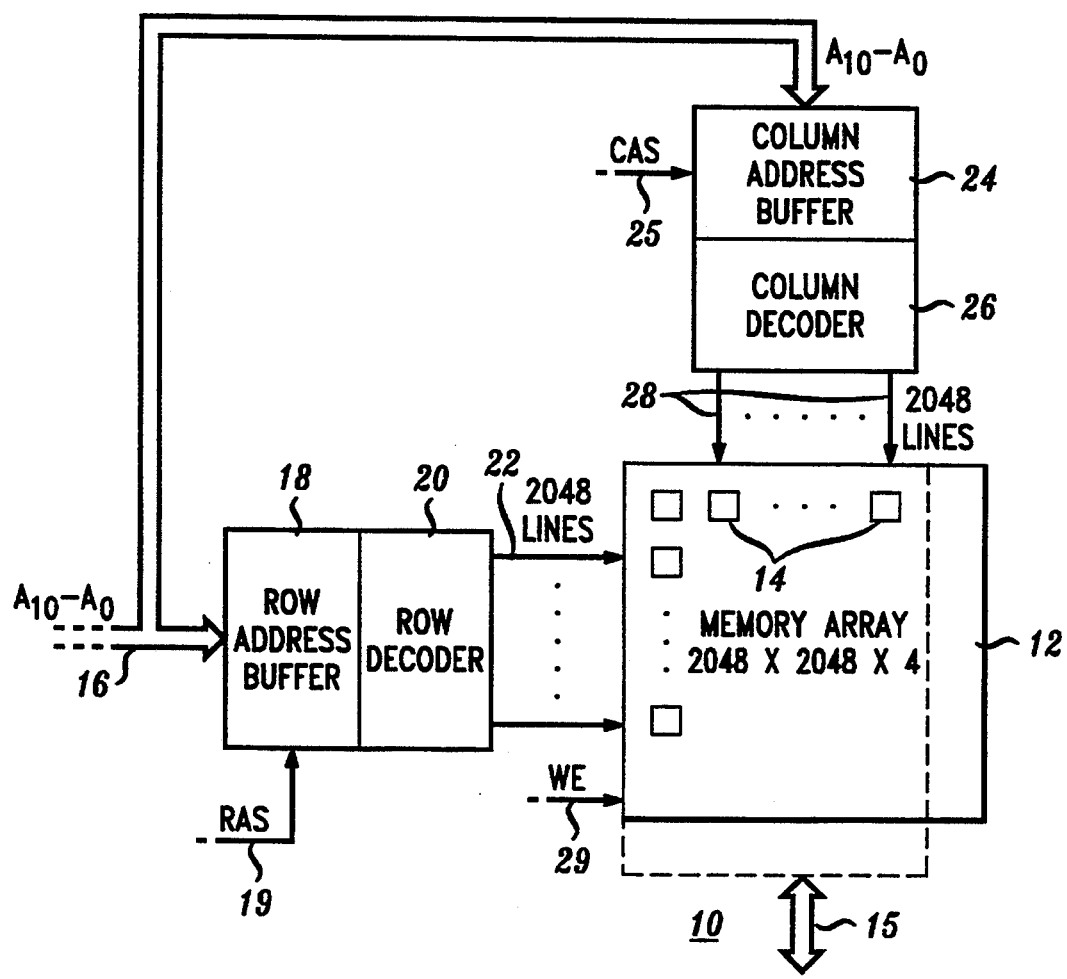
FIG. 1 is a block schematic diagram of a prior-art DRAM device of the 4M×4 type.

The present invention is directed to a technique for controlling a plurality of prior-art DRAM devices 10 (one shown in FIG. 1) irrespective of the DRAM device symmetry. As seen in FIG. 1, the DRAM device 10 which is of the 4M×4 type comprises a matrix array 12 of individual memory cells 14, the cells being arrayed in rows and columns. In the illustrated embodiment, the array 12 is comprised of two thousand forty-eight (2048) rows by two thousand forty-eight (2048) columns of cells 14, with each cell holding four bits of data, so that the total storage capacity of the array is 16M.

While the memory array 12 of the DRAM device 10 is depicted in FIG. 1 as comprised of an equal number of rows and columns of cells 14, the array need not be symmetric. As indicated by the dashed lines in FIG. 1, the memory array 12 could easily be asymmetric, with more rows than columns. For example, instead of being configured of 2048 rows×2048 columns of cells 14, the array 12 could be configured as 4096 rows×1024 columns of cells. It should be understood that the DRAM device 10 thus described is exemplary of DRAM devices generally and there exist devices having different size arrays 12.

Each individual cell 14 in the array 12 of the DRAM device 10 is accessed, for the purpose of writing data to the cell or reading data therefrom, by specifying the address of the cell. Once accessed, data are written to or read from the cell 14 via a data bus 15 common to the cells in the array 12. The number of bits required to uniquely address each individual cell 14 depends on the size of the array 12. For the array 12 of FIG. 1 comprised of 2048 rows by 2048 columns of cells 14, twenty-two bits are required to specify the address of each cell. As may be appreciated, a larger array (i.e., an array having more rows and columns) would require a larger address to specify the location of each individual cell 14 whereas a smaller array could employ a smaller address.

To reduce the number of required address lines, the DRAM device 10 multiplexes each incoming address. In the illustrated embodiment, the DRAM device 10 is provided with an eleven-bit address bus 16, each line of the address bus carrying one of eleven address bits $A_{10}$–$A_0$ that collectively specify either a row address or a column address. To address a particular cell 14 in the DRAM device 10, an eleven-bit row address is applied to the bus 16 to specify the address of the row containing the particular cell 14 of interest. Thereafter, an eleven-bit column address is applied to specify the address of the column containing the cell 14 to be accessed. (A larger array 12 would require a row address and a column address in excess of eleven bits.)

The address bus 16 is coupled to a row address buffer 18 controlled by a Row Address Strobe (RAS) signal carried on an RAS signal line 19. The RAS signal is forced to an active state when a row address is present on the bus 16 so that the row address can be latched in the buffer 18 when the RAS signal transitions from a 1 to a 0. The row address held in the buffer 18 is thereafter decoded by a row decoder 20 that controls a set of lines 22, each coupled to an individual one of the rows in the array 12. The row decoder 20 decodes the row address, and then forces a corresponding one of the lines 22 active to select the row of cells 14 whose address corresponds to the value latched in the buffer 18.

The address bus 16 is also coupled to a column address buffer 24 controlled by a Column Address Strobe (CAS) signal carried on a CAS line 25 in much the same way that the row address buffer 18 is controlled by the RAS signal carried on the RAS line 19. The column address is latched when the CAS signal transitions from a 1 to a 0. The column address latched in the buffer 24 is decoded by a column decoder 26 that controls a set of lines 28, each controlling a separate one of the columns in the array 12. Like the row decoder 20, the column decoder 26 decodes the column address word latched in the column address buffer 24 to select the particular column of cells corresponding to the column address value.

The general manner in which each individual cell 14 is addressed is the same regardless of whether the DRAM device 10 has a symmetric or asymmetric array 12 of cells. In each case, the row address and the column address are placed in sequence on the address bus 16. The only difference between addressing each individual cell 14 in an asymmetric DRAM device and in a symmetric DRAM device 10 is that each row address for the asymmetric DRAM device is longer because of the greater number of rows in the array 12 of cells 14.

Each DRAM device to also has a write signal line 29 on which a Write signal (WE) is placed to designate whether a write operation is to occur to write data into the array 12. When the signal WE transitions from a 1 to a 0, then data can be written to the array 12 into the cell 14 in the DRAM device whose row address and column address have been specified as described.

Figure 2:
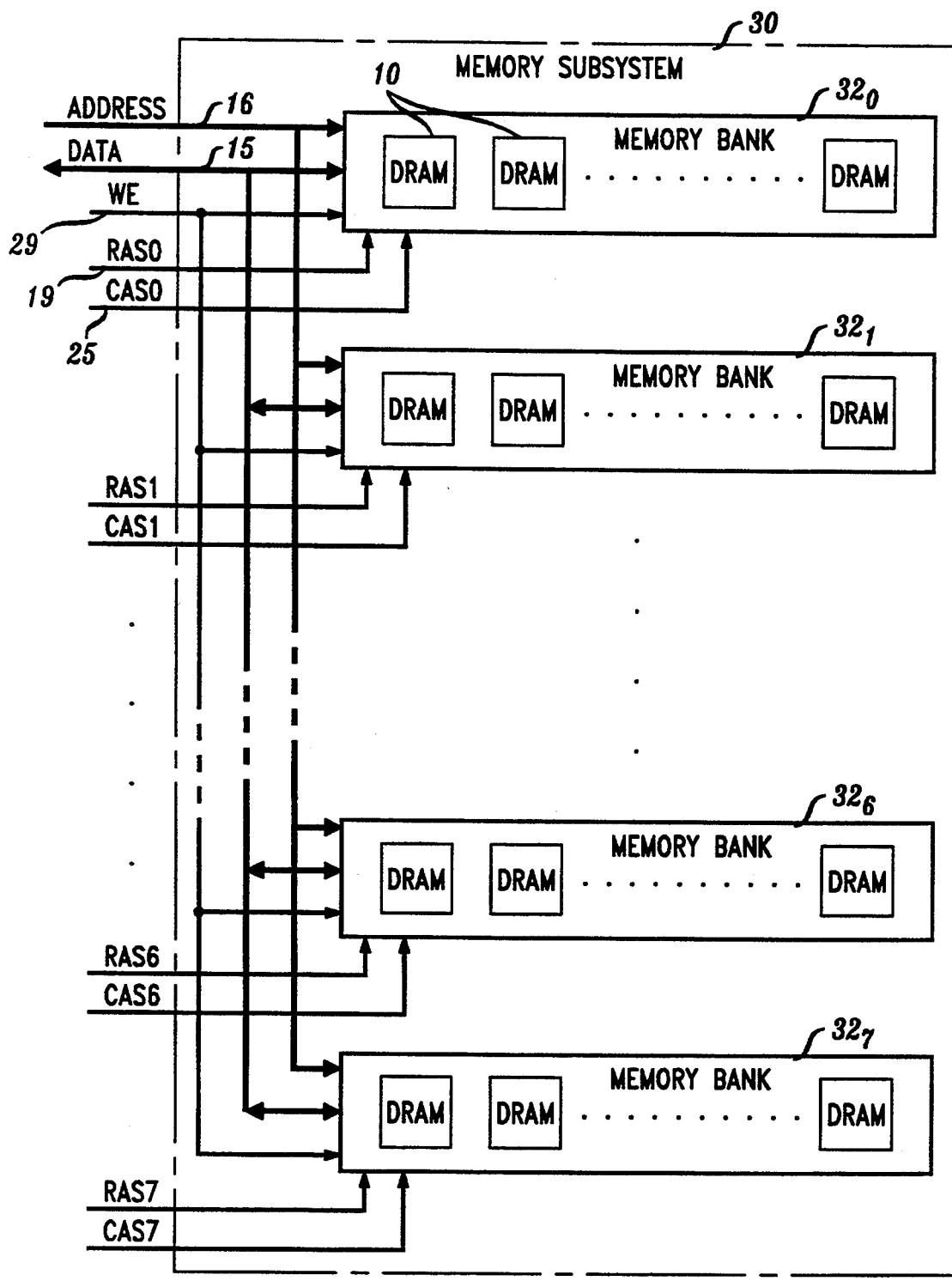
FIG. 2 is a block schematic diagram of a prior art memory system containing a plurality of banks of DRAM devices of the type shown in FIG. 1.

Referring to FIG. 2, there is shown a memory System 30, typically in the form of a circuit board or the like, that carries a plurality of DRAM devices 10. In the illustrated embodiment, the DRAM devices 10 within the system 30 are arranged in eight banks $32_0$–$32_7$ although it should be understood that a larger or smaller number of banks is possible. The number of DRAM devices 10 in each bank depends on the size of the data word to be stored. In the illustrated embodiment, each bank stores thirty-two-bit binary words. With cell 14 of FIG. 1 of each DRAM device 10 storing four bits, eight DRAM devices 10 are required in each bank for the bank to store thirty-two-bit binary words. Depending on the number of bits stored by each cell 14 in each DRAM device 10, and the size of the word to be stored by each of the banks $32_0$–$32_7$, each bank may be comprised of more or less than eight DRAM devices 10.

Each of the DRAM devices 10 in each bank of the banks $32_0$–$32_7$ has its address bus 16 coupled to the address bus of the other DRAM devices in the same bank. Thus, the parallel combination of the address busses 16 of the DRAM devices 10 in each bank serves as the address bus for that bank. The address bus 16 of each of the banks $32_0$–$32_7$ is coupled to those of the other banks. In this way, a single address may be applied to all of the banks $32_0$–$32_7$ at once on the collective bus 16. The data bus 15 of each DRAM device 10 is coupled to the data bus of each of the other DRAMs in the same bank. This common data bus 15 of each bank is coupled to the common data bus of the other banks in parallel. In this way, the memory system 30 has both a common data bus 15 and a common address bus 16.

Each DRAM device 10 in each bank has its RAS signal line 19 and its CAS signal line 25 coupled to the RAS lines and CAS lines, respectively, of the other DRAM devices in the same bank. Thus, the parallel combination of the RAS lines 19 and CAS lines 25 of the DRAM devices 10 in each bank serves as the RAS lines and CAS lines, respectively, for that bank. Each of the banks $32_0$–$32_7$ is supplied with separate RAS signals and CAS signals, Which, for purposes of clarity, have been labeled RAS0, CAS0, RAS1, CAS1 ... RAS7, CAS7, respectively, to indicate their correspondence to the banks $32_0$–$32_7$, respectively. To access the DRAM devices 10 in a particular one of the memory banks $32_0$–$32_7$, the RAS line and CAS line associated with that bank are asserted while the RAS lines and CAS lines of the other banks remain deactivated. Thus, even though the same address is applied to the banks $32_0$–$32_7$ in unison, only the bank whose RAS line 19 and CAS line 25 are asserted in sequence will respond to the address on the address bus 16

Like the address bus 16, the write signal line 29 of each DRAM device 10 in each bank is coupled to the write signal line of the other devices in the same bank. Further, the write signal line 29 of each bank of the banks $32_0$–$32_7$ is coupled to the write signal line of the other banks. Thus, by asserting a write signal WE on the common write signal bus, data can be written to the DRAM devices 10 in any of the banks $32_0$–$32_7$, depending on which bank had its RAS line and CAS line asserted.

Figure 3:
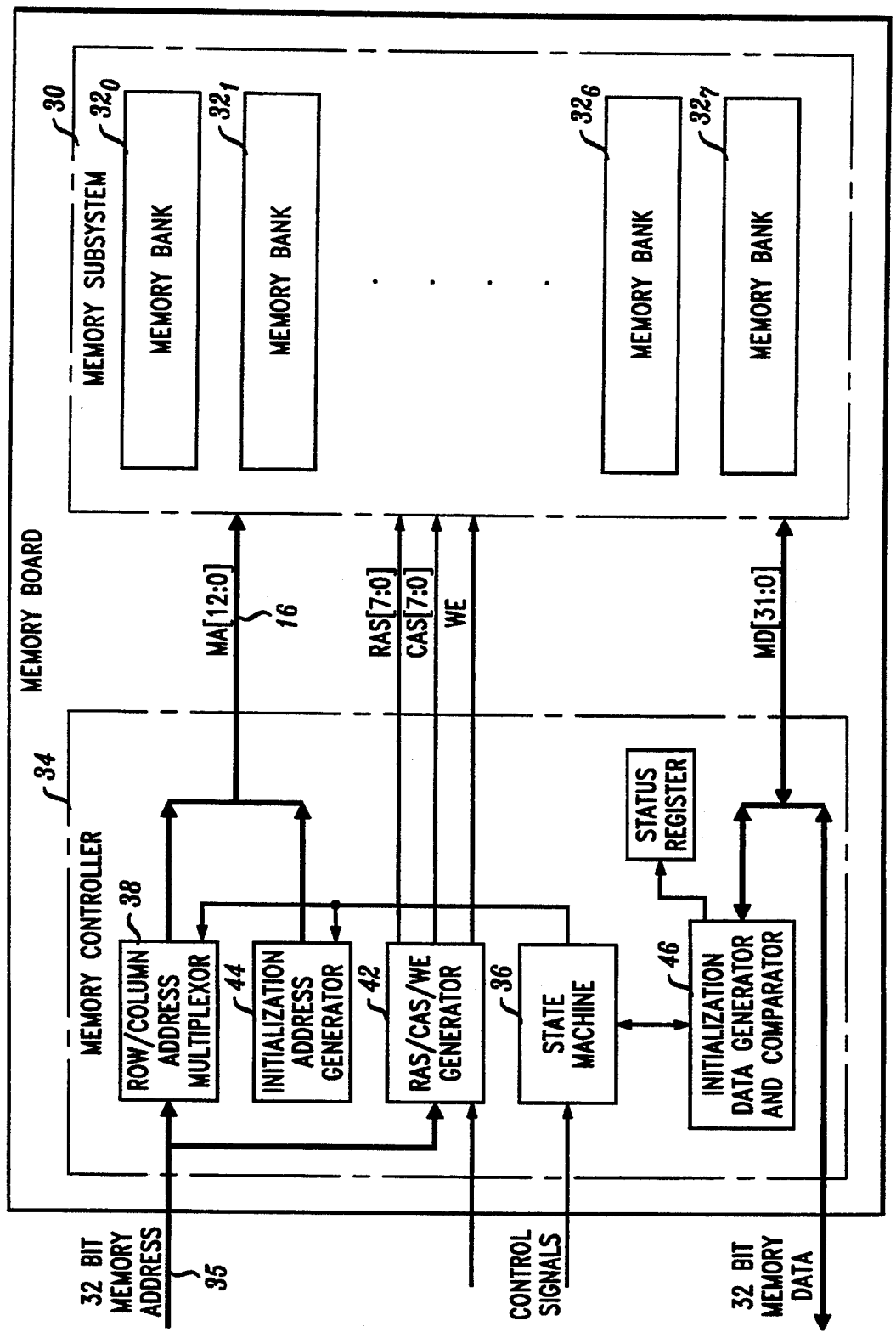
FIG. 3 is a block schematic diagram of a memory controller, in accordance with the invention, for controlling the DRAM devices in the memory system of FIG. 2.

Control of the DRAM devices 10 in the banks $32_0$–$32_7$ is accomplished, in accordance with the invention, by a memory controller 34 shown in schematic form in FIG. 3. As will be discussed in greater detail, the memory controller 34 advantageously controls the addressing of the DRAM devices 10 in the banks $32_0$–$32_7$, irrespective of the DRAM device symmetry, thus allowing each bank to be populated with asymmetric and/or symmetric DRAM devices. The controller 34 accomplishes the addressing function by generating RAS and CAS signals, as well as a complete row address and a complete column address, in accordance with an incoming address that specifies a cell 14 (see FIG. 1) to be addressed, the incoming address being supplied on a bus 35. The RAS and CAS signals generated by the controller 34 designate the particular bank containing the DRAM devices 10 whose cell 14 is specified by the address value on the bus 35. As will be discussed below, the complete row address and complete column address specify the row and column, respectively, of the cell 14 in the DRAM devices 10 in the designated bank regardless of the DRAM device symmetry to permit the addressing of symmetric and asymmetric devices in the same bank.

The controller 34 includes a state machine 36 that controls a row/column address multiplexor 38 and a RAS/CAS/WE generator 42. The RAS/CAS/WE generator 42 decodes a portion of the address on the bus 35 to generate the RAS and CAS signals for designating (selecting) the appropriate one of the banks $32_0$–$32_7$ to be addressed. The multiplexor 38 multiplexes the incoming address on the bus 35 in accordance with the configuration of the DRAM devices 10 in the banks $32_0$–$32_7$ to generate the complete row address and column address needed to access the particular cell of interest in the designated bank. The details of the multiplexor 38 will be described hereinafter with respect to FIG. 7. The RAS/CAS/WE generator 42 is of a conventional design and also serves to generate the write signal WE in response to an external control signal from a processor (not shown) or the like.

In addition to controlling the multiplexor 38, the state machine 36 controls an initialization address generator 44 that generates each of four first addresses during initialization of the memory system 30. These four first addresses are referred to as "presence addresses" because they specify cells 14 (see FIG. 1) that are accessed in the DRAM devices 10 in each of the banks $32_0$–$32_7$ during an initialization process (described hereinafter) that occurs immediately after the memory system 30 is powered up for the purpose of writing data thereto and reading data therefrom to determine which DRAM devices are present in each bank. The initialization address generator 44 also generates four second addresses ("size addresses") that specify four cells 14 in each DRAM device 10 in each bank that are accessed during the initialization process. These four locations are accessed to write data thereto and read data therefrom for the purpose of finding the size (density) of the DRAM device.

Further, the state machine 36 controls an initialization data generator and comparator 46. As will be discussed, the generator 46 writes each of four data patterns to a corresponding one of the cells 14 located at the four presence addresses during the initialization process. After each write operation, the cells 14 at the four presence addresses are read by the generator 46 to determine if the particular data pattern previously written to each cell has been Correctly read in order to establish the DRAM device 10 presence. Also, the initialization data generator and comparator 46 operates to write each of the four data patterns to, and to read each of the four data patterns from, the four cells 14 located at the four size addresses for the purpose of determining the size of the DRAM devices 10 in the banks $32_0$–$32_7$. By determining the presence and size of the DRAM devices 10 in the banks $32_0$–$32_7$, the configuration of the memory system 30 can be established to enable generation of a complete row and complete column address for normal addressing of the DRAM devices 10.

Figure 4:
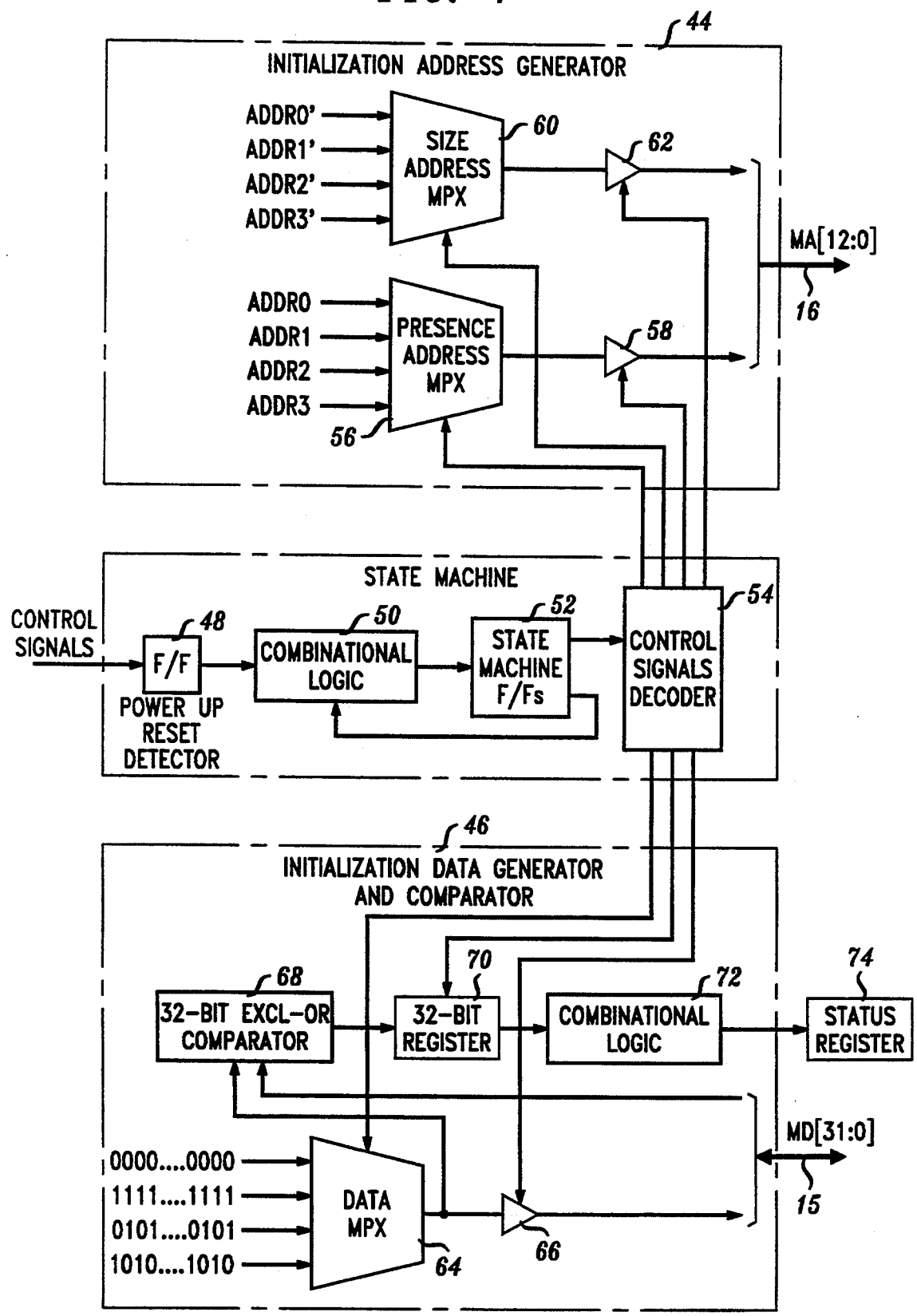
FIG. 4 is a block schematic diagram of a portion of the memory controller of FIG. 1 showing the details of several elements therein.

Referring to FIG. 4, the state machine 36 includes a power-up reset detector 48 (e.g., a flip-flop) that is set upon a power-up condition. In practice, the flip-flop 48 is set by an external control signal that goes active upon such a condition. The flip-flop 48 actuates a combinatorial logic circuit 50 coupled to a set of state machine flip-flops 52. In response to signals from the combinatorial logic circuit 50, the flip-flops 52 generate a set of signals that are decoded by a decoder 54 to yield control signals that control the row/column address multiplexor 38 (see FIG. 3), the initialization address generator 44 and the initialization data generator and comparator 46. The structure of the combinatorial logic circuit 50 and the state machine flip-flops 52 will be apparent to those skilled in the art from the operation of the initialization address generator 44 and the initialization data generator and comparator 46, as described with respect to FIGS. 5 and 6, and from the operation of multiplexor 38 as described with respect to FIG. 7.

As seen in FIG. 4, the initialization generator 46 includes a first multiplexor 56 that selectively passes one of four addresses ADDR0, ADDR1, ADDR2 and ADDR3 to a buffer 58 in accordance with a control signal from the state machine 36. The address received in the buffer 58 is passed to the memory system 30 (see FIG. 3) via address bus 16 upon a power-up condition in response to a control signal from the state machine 36 of FIG. 4.

The four addresses ADDR0, ADDR1, ADDR2 and ADDR3 are the "presence addresses" because each represents an address in each bank that is accessed to determine if the DRAM device 10 is present. Each presence address is selected to represent a valid address location for the smallest density DRAM device 10 (typically, 256K) expected to be present in any of the banks $32_0$–$32_7$. Since the multiplexor 56 serves to selectively pass one of the presence addresses ADDR0, ADDR1, ADDR2 and ADDR3, the multiplexor is thus labeled as the "presence address multiplexor."

In the illustrated embodiment, the four presence addresses ADDR0, ADDR1, ADDR2 and ADDR3 are chosen as follows:

TABLE I

| |
|---|
| ADDR0 = [ROW0 (0 0000 0000 0000) COL0 (0 0000 1111 1111)] |
| ADDR1 = [ROW1 (0 0100 0000 0001) COL1 (0 0010 1111 1111)] |
| ADDR2 = [ROW2 (0 1100 0000 0011) COL2 (0 0110 1111 1111)] |
| ADDR3 = [ROW3 (1 1100 0000 0111) COL3 (1 1110 1111 1111)] |

Each of the presence addresses ADDR0, ADDR1, ADDR2 and ADDR3 is comprised of a thirteen-bit row address portion and a thirteen-bit column address portion. Thus, each of the presence addresses ADDR0, ADDR1, ADDR2 and ADDR3 has a row address portion of a sufficient length to enable addressing of an asymmetric 16M DRAM device comprised of 8192 rows by 2048 columns of cells 14 of FIG. 1. (Although neither symmetric nor asymmetric 16M devices having 16M separate locations are yet available, they are expected in the future.) Should the banks $32_0$–$32_7$ include DRAM devices having a greater density, then the length of the presence addresses ADDR0, ADDR1, ADDR2 and ADDR3 would be increased accordingly. (However, regardless of their length, the presence addresses still select four valid locations in the smallest density DRAM device.) When the presence addresses ADDR0, ADDR1, ADDR2 and ADDR3 are each applied to a DRAM device 10 smaller than 16M, the higher order bits of each presence address will drop out under such circumstances.

In addition to the presence address multiplexor 56, the initialization address generator 44 includes a second multiplexor 60 that selectively passes to a buffer 62 a separate one of four second addresses ADDR0', ADDR1', ADDR2' and ADDR3' in accordance with a control signal from the state machine 36. Like the buffer 58, the buffer 62 is also coupled to the address bus 16 for passing the contents of the buffer to the bus in response to a control signal from the state machine 36.

The second addresses ADDR0', ADDR1', ADDR2' and ADDR3' are the "size" addresses because they each designate the location of a corresponding one of four cells 14 (see FIG. 1) into which data is written and from which data is read to determine the size of each DRAM device 10 in each bank. In the illustrated embodiment, the size addresses ADDR0', ADDR1', ADDR2' and ADDR3' are chosen as follows:

TABLE II

| | |
|---|---|
| (ROW0 = 0 0000 0000 0000, | COL0 = 0 0000 1111 1111), |
| (ROW1 = 0 0100 0000 0000, | COL1 = 0 0010 1111 1111), |
| (ROW2 = 0 1100 0000 0000, | COL2 = 0 0110 1111 1111), |
| (ROW3 = 1 1100 0000 0000, | COL3 = 1 1110 1111 1111). |

Each of the size addresses ADDR0' ADDR1', ADDR2' and ADDR3' designates an individual cell 14 (see FIG. 1) which is separated from the cell designated by the next successive size address by a distance (as measured by the number of intervening cells) corresponding to the difference in DRAM density. Thus, the size address ADDR0' designates a cell 14 found in those DRAM devices having a 256K or larger density. In contrast, the size address ADDR1' designates a cell 14 found only in DRAM devices having at least a 1M density while the size addresses ADDR2' and ADDR3' designate cells 14 that are found only in devices having at least a 4M and 16M density, respectively.

Each of the presence addresses ADDR0, ADDR1, ADDR2 and ADDR3 and the size addresses ADDR0', ADDR1', ADDR2' and ADDR3' is chosen so as to specify a cell in DRAM device 10 whose location is the same regardless of the DRAM symmetry. In this way, the presence and size addresses can be employed to detect the presence and the size, respectively, of the DRAM devices 10 irrespective of their symmetry.

Referring to FIG. 4, the initialization data generator and comparator 46 comprises a data multiplexer 64 that selectively passes one of four thirty-two-bit data patterns 000 ... 0000, 111 ... 1111, 1010 .. 1010 and 0101 ...0101 to a buffer 66 in accordance with the state of a two-bit control signal from the state machine 36. Each of the four data patterns, referred to as D0, D1, D2 and D3, respectively, is generated by a conventional signal generator (not shown). In response to a control signal from the state machine 36, the buffer 66 passes the value held thereby to the data bus 15.

The output signal of the data multiplexor 64 is supplied to a thirty-two-bit exclusive-OR comparator 68 that is also coupled to the data bus 15. The exclusive-OR comparator 68 exclusively OR's the pattern passed by the multiplexor 64 with a data pattern read from the DRAM devices 10 of a designated one of the banks $32_0$–$32_7$ of FIG. 3 via the bus 15. In this way, the exclusive-OR comparator 68 determines whether one of the data patterns D0, D1, D2 and D3 written into the DRAM devices 10 of each of the banks $32_0$–$32_7$ has been successfully read from that bank.

The output signal of the exclusive-OR comparator 68 is supplied to, for storage in, a thirty-two-bit register 70 under the control of the state machine 36. The bits held by the register 70 are processed by a combinational logic circuit 72 to determine whether the thirty-two-bit pattern held by the register represents a match between the data pattern written into the designated one of the banks $32_0$–$32_7$ of FIG. 3 and the data pattern subsequently read from the same bank. The output signal of the combination logic circuit 72 is stored in a status register 74.

The initialization data generator and comparator 46 determines whether each of the four data patterns D0, D1, D2 and D3 written into the cells 14 (see FIG. 1) located at the presence addresses ADDR0, ADDR1, ADDR2 and ADDR3, respectively, and located at the size addresses ADDR0', ADDR1', ADDR2' and ADDR3', respectively, have been successfully read therefrom. By determining whether each of the four data patterns passed by the multiplexor 64 can be written into and successfully read from each of the four cells 14 at the presence addresses, the initialization data generator and comparator 46 determines the presence of the DRAM devices 10 in the banks $32_0$–$32_7$. Information obtained by the initialization data generator and comparator 46 indicative of which DRAM devices 10 are present is stored in a status register 74. Similarly, by determining whether each of the four data patterns passed by the multiplexor 64 can be written to and successfully read from the cells at the size addresses ADDR0', ADDR1', ADDR2' and ADDR3', respectively, the initialization data generator and comparator 46 thus determines the density of the DRAM devices 10 in the banks $32_0$–$32_7$ in FIG. 3. The information obtained by the initialization data generator and comparator 46 indicative of the density of the DRAM devices 10 is likewise stored in the status register 74.

Figure 5:
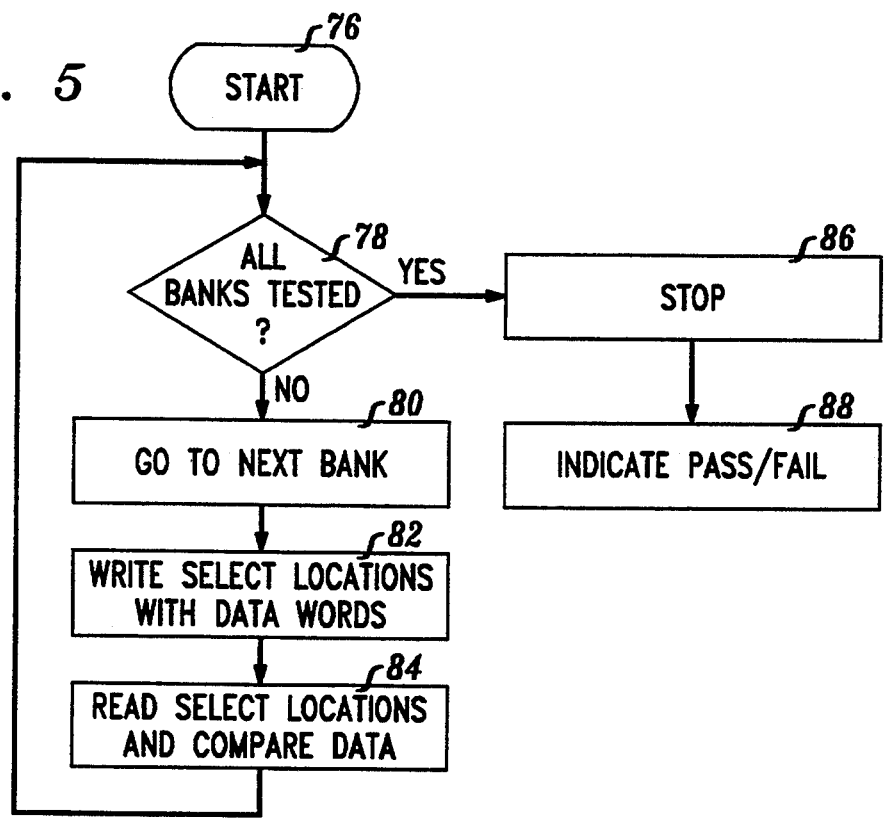
FIG. 5 is a flowchart representation of a method, in accordance with the invention, for detecting the presence of the DRAM devices in the memory system of FIGS. 2 and 3.

A better understanding of how the initialization data generator and comparator 46 and the initialization address generator 44 cooperate to determine the presence of the DRAM devices 10 can be had by reference to the flowchart of FIG. 5. The process of determining the presence of the DRAM devices 10 in the banks $32_0$–$32_7$ is initiated upon the execution of a start instruction (step 76) whereupon the various elements, including register 70, are cleared. Thereafter, step 78 is executed and a determination is made whether all of the banks $32_0$–$32_7$ of FIG. 3 have been tested by writing data thereto and reading data therefrom. (Upon the initial execution of the process of FIG. 5, none of the banks $32_0$–$32_7$ will have been tested so that following step 78, step 80 is executed and the next untested bank (bank $32_0$ in the first instance) is selected for testing.) Following step 80, step 82 is executed whereupon the data patterns D0, D1, D2 and D3 are written into the cells 14 located at the addresses ADDR0, ADDR1, ADDR2 and ADDR3, respectively, in the DRAM devices 10 in the currently selected bank. Thus, the data pattern D0 is written into the cell 14 at the address ADDR0 while the data pattern D1 is written to the cell at the address ADDR1 and so on. Next step 84 is executed and the cells 14 at the addresses ADDR0, ADDR1, ADDR2 and ADDR3 are each read in sequence and the data read therefrom are compared to the pattern previously written therein to determine if the data patterns D0, D1, D2 and D3, respectively, are present at the addresses ADDR0, ADDR1, ADDR2 and ADDR3, respectively.

If each of the data patterns D0, D1, D2 and D3 is read from the corresponding one of the presence addresses ADDR0, ADDR1, ADDR2 and ADDR3, respectively, then the DRAM device 10 into which the patterns were written is deemed to be present. An inability to read each of the previously written data patterns D0, D1, D2 and D3, from a corresponding one of the size addresses ADDR0, ADDR1, ADDR2 and ADDR3, respectively, signifies that the DRAM device is not present. Note that a DRAM device 10 that is physically present may be unable to be written to and read from. Such a defective device will thus be deemed not present.

Following step 84, step 78 is re-executed. Unless all of the banks $32_0$–$32_7$ of FIG. 3 have been tested by writing the data patterns D0, D1, D2 and D3 to the addresses ADDR0, ADDR1, ADDR2 and ADDR3, respectively, and reading the patterns therefrom, then steps 80, 82 and 84 are re-executed in sequence. Once all of the banks $32_0$–$32_7$ have been tested, then, following step 78, step 86 is executed and the process is stopped. Thereafter, Step 88 is executed and the status register 74 is written with data indicating whether each of the banks $32_0$–$32_7$ passed or failed the test, as indicated by the presence or absence, respectively, of the requisite number of DRAM devices 10 in each bank.

In order for each bank to pass the test imposed during step 84, each of the four data patterns D0, D1, D2 and D3 must have been properly read from a corresponding one of the presence addresses ADDR0, ADDR1, ADDR2 and ADDR3, respectively, in each DRAM device in the bank. A failure of any of the DRAM devices 10 in a bank to pass this test implies that the device failing the test is not present. For each DRAM device 10 that is deemed present, a "1" is written in the status register 74 for that device. Otherwise a "0" is written.

Figure 6:
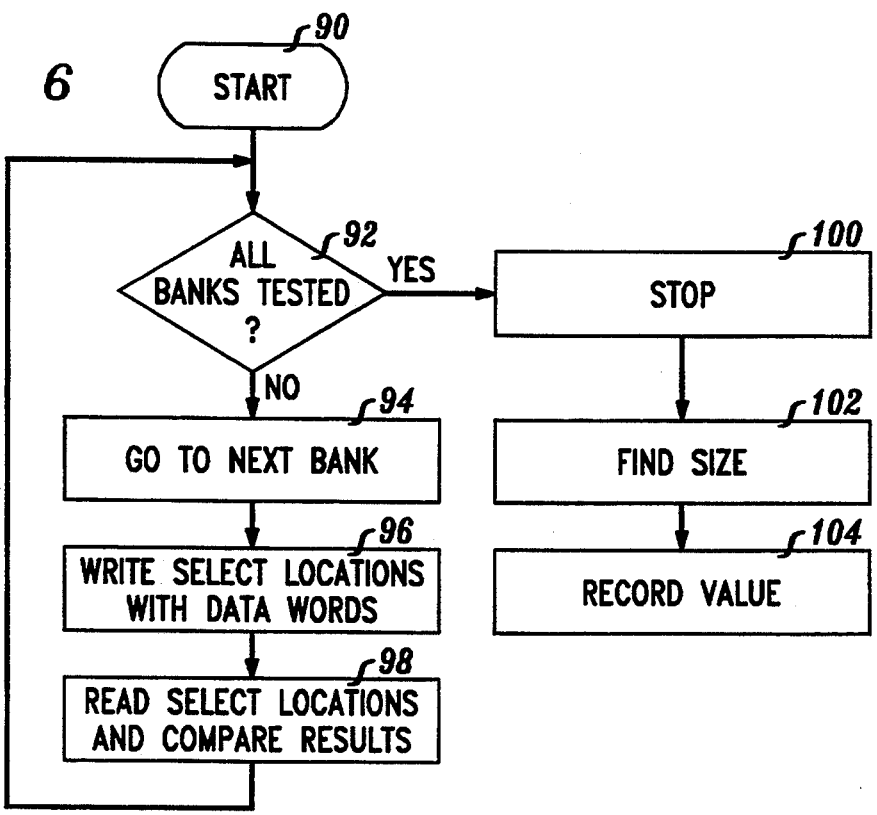
FIG. 6 is a flowchart representation of a method, in accordance with the invention, for determining the size of the DRAM devices in the memory system of FIGS. 2 and 3.

FIG. 6 shows a flowchart depicting the steps in the procedure that are executed to determine the size of each of the DRAM devices 10 in each of the banks $32_0$–$32_7$ of FIG. 3. The size determination procedure is begun upon the execution of a start instruction (step 90) whereupon the various elements, including register 70 are cleared. Thereafter, step 92 is executed and a determination is made whether all of the banks $32_0$–$32_7$ of FIG. 3 have been tested for the purpose of determining their size by writing data thereto and reading data therefrom. Upon the initial execution of the process of FIG. 8, none of the banks $32_0$–$32_7$ will have been tested so that following step 92, step 94 is executed and the next untested bank (bank $32_0$ in the first instance) is selected for testing. Following step 94, step 96 is executed whereupon the data patterns D0, D1, D2 and D3 are written into the cells 14 located at the size addresses ADDR0', ADDR1', ADDR2' and ADDR3', respectively, in the DRAM devices 10 in the currently selected bank. Thus, the data pattern D0 is written into the cell 14 at the address ADDR0' while the data pattern D1 is written to the cell at the address ADDR1' and so on.

Next step 98 is executed and the cells 14 at the addresses ADDR0', ADDR1', ADDR2' and ADDR3' are each read and the data read are compared to the pattern previously written therein to determine if the data patterns D0, D1, D2 and D3, respectively, are present at the addresses ADDR0', ADDR1', ADDR2' and ADDR3', respectively. As indicated previously, the size addresses ADDR0', ADDR1', ADDR2' and ADDR3' are separated from each other in accordance with the expected DRAM device densities (256K, 1M, 4M and 16M, respectively, in the present embodiment). If each of the four size addresses ADDR0', ADDR1', ADDR2' and ADDR3', when read, is found to contain a corresponding one of the data patterns D0, D1, D2 and D3, respectively, then the DRAM device 10 is deemed a 16M device.

Consider the situation when the DRAM device 10 is 256K. In accordance with the previously described process, the ADDR0' will be written with the data value D0. Next, the data value D1 is written to ADDR1', but since ADDR1'=ADDR0' for a 256K DRAM device, the location ADDR0' is overwritten with the data pattern D1. Thereafter, the data pattern D2 is written into the address ADDR2'. However, for the 256K DRAM device, the address ADDR2'=ADDR1'=ADDR0'. Hence, the address ADDR0' will be overwritten with the data pattern D2. Lastly, the data pattern D3 is written into the address ADDR3', but since ADDR3'=ADDR2'=ADDR1'=ADDR0' for the 256K DRAM device, the data value D3 will overwrite the value previously written into ADDR0'.

When the address ADDR0' is read, the data pattern that is found will be D3, not D0, so a mismatch exists. Likewise, when each of the addresses ADDR1' and ADDR2' is read, a corresponding one of the data patterns D1 and D2, respectively, will not be found. Only the address ADDR3', when read, will be found to contain its corresponding data pattern D3. As a consequence, when a mismatch is found for all but the size address ADDR3', then the DRAM device being tested is deemed to be a 256K device.

Using this process, a 4M DRAM device 10 will exhibit a mismatch only for the size address ADDR2', while the size addresses ADDR0',ADDR1', and ADDR3' will each be found to contain a corresponding one of the data patterns D0, D1 and D3, respectively. By the same token; a 1M DRAM device 10 will exhibit a mismatch at the size address ADDR1' and ADDR2', while the addresses ADDR0' and ADDR3' will each be found to contain a corresponding one of the data patterns D0 and D3, respectively.

Following step 98, step 92 is re-executed. Unless all of the banks $32_0$-$32_7$ of FIG. 3 have been tested by writing data thereto and reading therefrom, then steps 94, 96 and 98 are re-executed in sequence. Once all of the banks $32_0$-$32_7$ have been tested, then, following step 98, step 100 is executed and the process is stopped. Thereafter, step 102 is executed and the size of the DRAM device is determined in accordance with the data patterns D0, D1, D2 and D3 that have been correctly read from the locations ADDR0', ADDR1', ADDR2' and ADDR3', respectively, in the manner described previously. Thereafter, the status register 74 of FIG. 4 is written with data to indicate the density of the DRAM during step 104. Since there are four possible densities in the present embodiment, a two-bit value is written for each DRAM. A "00" is written for a 256K device, a "01" for a 1M device, a "10" for a 4M device and an "11" for a 16M device. Thus, as may now be appreciated, for each DRAM 10, there are three bits stored in the status register 74, one bit indicating the DRAM presence, and two bits indicative of the DRAM density.

It should be noted that the process described with respect to FIG. 8 for determining the DRAM device size could, if desired, be utilized simultaneously to determine the DRAM device presence. Rather than write to each of the addresses ADDR0, ADDR1, ADDR2 and ADDR3, it would be possible to verify the presence of each DRAM device 10 simply by writing to the address ADDR0'. If the data pattern D0 were correctly read from the address ADDR0', then the DRAM device 10 would obviously be present. The absence of the data pattern D0 at this location would signify the lack of the DRAM device (or that the DRAM device was defective). Thus, at a minimum, only the four locations ADDR0', ADDR1', ADDR2' and ADDR3' need to be written to and then read from for the purpose of determining both the presence and size of the DRAM devices 10.

However, even though it would be possible to determine both the DRAM device presence and Size by means of the process of FIG. 8, there is a distinct advantage to determining the DRAM device presence by the method of FIG. 7. Often, the data bus 15 and/or the address bus 16 of FIG. 3 may be "floating," that is, the signal level on the bus may change at various times. Thus, a single write operation to the address ADDR0' may be insufficient to establish the presence of the DRAM device with any high degree of confidence. Hence, four separate write operations are performed to assure an accurate determination of the DRAM device presence. It is for this same reason that different data patterns are written to each of the presence and size addresses ADDR0, ADDR1, ADDR2 and ADDR3 and ADDR0', ADDR1', ADDR2' and ADDR3', although the same pattern could be written to each address if a reduced degree of accuracy can be tolerated.

Referring to FIG. 3, information about the DRAM devices 10 gained in the manner above is utilized by the row/column address multiplexor 38 during normal (i.e., non-start-up) operation of the memory system 30 to enable the multiplexor to multiplex the address on the bus 35 to properly address the banks $32_0$-$32_7$ of DRAM devices 10. In accordance with the invention, the row/column address multiplexor 38 multiplexes the address on the bus 35 to yield a "complete" row address value and a "complete" column address value which allows the DRAM devices 10 to be addressed irrespective of their symmetry. Thus, upon decoding by either an asymmetric or symmetric DRAM device 10, the complete row address value and complete column address value designate the proper row and column, respectively, containing the cell 14 (see FIG. 1) of interest.

Referring now to FIG. 7, there is shown a block schematic diagram of the ROW/ADDRESS multiplexor 38. As seen in FIG. 9, the multiplexor 38 includes a bank decoder 106 that is supplied from the incoming address bus 35 with the address bit segment A[31:20], which designates a particular one of the banks $32_0$-$32_7$ in the memory system 30 of FIG. 2 containing the memory cells 14 (see FIG. 1) of interest. The bank decoder 106 is conventional in its design, and decodes the address bit segment A[31:20] by rendering a corresponding one of a set of bank select lines $108_0$-$108_7$ active, each active line representing the selection of a separate one of the memory banks $32_0$-$32_7$, respectively.

The bank select lines $108_0$-$108_7$ are coupled to a bank density multiplexor 110 also coupled to the status register 74 previously described. The bank density multiplexor 110 is conventional in its design and operates to multiplex the bank density status information in the register 74 with the information on the lines $108_0$-$108_7$ as to which bank is selected. The output of the bank density multiplexor is a two-bit signal indicative of the density of the DRAM devices 10 in the selected one of the banks $32_0$–$32_7$, as indicated by the active one of the bank select lines $108_0$–$108_7$. Thus, for example, if the bank selected by the bank decoder 106 contains 16M DRAM devices, as established by the density value for that bank stored in the status register 74, then the output signal of the density multiplexor 110 will be a "11." The bank density multiplexor 110 output signal will be "00," "01," and "10" when the selected bank is comprised of 256K, 1M and 4M DRAM devices, respectively.

The output of the bank density multiplexor 110 serves as a control signal for both a row address multiplexor 112 and a column address multiplexor 114. The row and column address multiplexors 112 and 114 have their respective outputs coupled to the input of one of a pair of buffers 116 and 118, respectively, that feed the common address bus 16 of the memory system 30 of FIG. 2. Each of the multiplexors 112 and 114 selectively passes an address at each of its four inputs to its output in accordance with the state of the control signal received from the bank density multiplexor 110.

As will become better understood hereinafter, the row address multiplexor 112 is supplied at each of its four inputs with the address bit segments A10,A[19:11], A11,A[21:12], A12,A[23:13] and A13,A[25:14], respectively, obtained from the address A[31:0] on the bus 35. As will become better understood hereinafter, the address bit segments A10,A[19:11], A11,A[21:12], A12,A[23:13] and A13,A[25:14] completely specify the row address for a 256K, a 1M, a 4M and a 16M DRAM device, respectively, regardless of the device symmetry. The column address multiplexor 114 is supplied at each of its four inputs with a separate one of the address bit segments A[10:2], A[11:2], A[12:2], and A[13:21. Just as the address bit segments A10,A[19:11], A11,A[21:12], A12,A[23:13] and A13,A[25:14] completely specify the row address for a 256K, a 1M, a 4M and a 16M DRAM device, respectively, regardless of the device symmetry, the column address bit segments specify the complete column address for each respective density DRAM device.

To understand how the row address and column address multiplexor 38 operates, reference should be had to Table III which depicts the complete row and column addresses for different density DRAM devices 10.

TABLE III

| DRAM Device Density | Row · Address Bit Segment | Column Address Bit Segment |
|---|---|---|
| 256K | A10,A[19:11] | A10,A[9:2] |
| 1M | A11,A[21:12] | A11,A[10:2] |
| 4M | A12,A[23:13] | A12,A[11:2] |
| 16M | A13,A[25:14] | A13,A[12:2] |

With regard to the address bit segments depicted in Table III, each of the address bit segments begins with the bit A2. The bits A0 and A1 are reserved to specify which of the four individual bytes in the thirty-two-bit storage word are of interest.

Referring to Table III, consider the row address bits and column address bit segments for a 16M DRAM device 10 containing 16M discrete cells 14. For a symmetric 16M device, the column address seen by the device comprises the bits A13, A[12:2], and the row address seen by the device comprises A[25:14]. The highest order bit (A13) of the row address will drop off because the row decoder 20 (see FIG. 1) of a symmetric 16M DRAM device will only decode the lowest-order twelve bits of the row address value supplied to it. For an asymmetric 16M device, the column address actually seen by the device comprises only the bits A[12:2] because the highest order bit (A13) of the complete column address will drop off since the column decoder 26 (see FIG. 1) of the device only decodes the lowest order eleven bits.

For a 16M asymmetric DRAM device 10, the row address seen by the device is A13, A[25:14] rather than A[25:13]. The complete row address generated by the multiplexor 38 is a permutation of the conventional row address for an asymmetric DRAM device 10 wherein the row address bit which would ordinarily be the lowest-order bit now becomes the highest order one. Each permuted row address generated by the multiplexor 38 maps in a one-to-one fashion with each conventional asymmetric row address, and upon decoding by the row decoder 20 of FIG. 1, specifies the same row as a conventional asymmetric row address value. Thus, by permuting the row address values in this fashion, the row/column address multiplexor 38 of FIG. 3 generates complete row address and column address values that simultaneously specify the row and column addresses for both asymmetric and symmetric DRAM devices.

To generate the complete row address and column address values, the row/column address multiplexor 38 thus must know the size of the DRAM devices in order to permute the proper row address bits. In the event that the density of the DRAM devices 10 is known at the outset, such information could be pre-loaded into the status register 74. Otherwise, it becomes necessary to perform the initialization routine of FIG. 8 to determine the DRAM device density upon a power-up condition of the memory system 30 of FIG. 2.

The foregoing describes a controller 34 for controlling a plurality of banks $32_0$–$32_7$ of DRAM devices 10 to enable the DRAM devices to be addressed irrespective of their symmetry to enable both symmetric and asymmetric devices to be addressed.

It is to be understood that the above-described embodiments are merely illustrative of the principles of the invention. Various modifications and changes may be made thereto by those skilled in the art which will embody the principles of the invention and fall within the spirit and scope thereof.

I claim:

1. A method for controlling a plurality of banks of DRAM devices, each DRAM device comprised of a plurality of memory cells arrayed in rows and columns, each cell being uniquely identified by a row address and a column address, the method comprising the steps of:
    decoding an incoming address, specifying a cell of interest in each DRAM device in a bank, to designate the bank of DRAM devices each containing the cell of interest;
    multiplexing the incoming address to generate a complete row address that specifies the row in each DRAM device in the designated bank containing the cell of interest when each said DRAM device has an equal number of rows and columns, and simultaneously specifies the row containing the cell of interest row when the DRAM device has an unequal number of rows and columns;

multiplexing the incoming address to generate a complete column address that specifies the column in each DRAM device in the designated bank containing the cell of interest when each said DRAM device has an equal number of rows and columns, and that simultaneously specifies the row containing the cell of interest row when the DRAM device has an unequal number of rows and columns;

sequentially applying the complete row address and the complete column address to each DRAM device in the designated bank;

decoding only as much of the complete row address at each DRAM device as is necessary, in accordance with the number and columns in the DRAM device, to select the row containing the cell of interest; and decoding only as much of the complete column address at each DRAM device as is necessary, in accordance with the number and columns in the DRAM device, to select the row containing the cell of interest.

2. The method according to claim 1 wherein the step of multiplexing the incoming address to generate the complete row address includes the steps of:

multiplexing the incoming address to establish a row address specifying the row containing the cell of interest in each said DRAM for the condition when said DRAM is asymmetric; and permuting the row address by interchanging highest and lowest order bits to yield the complete row address.

3. The method according to claim 1 wherein the step of multiplexing the incoming address to generate a complete column address includes the step of multiplexing the incoming address to yield a column address which specifies the column containing the cell of interest for the condition when the DRAM is symmetric.

4. The method according to claim 1 further including the steps of:

establishing the presence of the DRAM devices in each bank; and establishing the density of the DRAM devices in each bank.

5. The method according to claim 4 wherein the step of determining the presence of the DRAM devices in each bank includes the steps of:

writing at least one data pattern into at least one cell known to exist in each possible DRAM device that may be present, the cell having an address which is the same regardless of whether the DRAM device is symmetric or asymmetric:

reading said one cell;

comparing the contents of said one cell to the data pattern written therein and generating a result indicative of such comparison, and indicating the presence of the DRAM device in accordance with the result of the comparison.

6. The method according to claim 4 wherein the step of determining the presence of the DRAM devices in each bank includes the steps of:

writing each of four separate data patterns into each of four cells, respectively, each cell known to exist in each possible DRAM device that may be present and each cell having an address which is the same irrespective of the DRAM device symmetry;

reading each cell;

comparing the contents of each cell to a separate one of the four data patterns and generating a result for each cell indicative of whether said separate data pattern is present in the cell; and indicating the presence of the DRAM device in accordance with the result of the comparison.

7. The method according to claim 4 wherein the step of determining the DRAM device density includes the steps of:

writing a data pattern into each of four cells whose addresses are separated by an amount corresponding to the possible variation in the density of the DRAM devices in the banks;

reading each of the four cells;

comparing the contents of each cell to the data pattern written therein and generating a result indicative of such comparison; and indicating the density of the DRAM device in accordance with the result of each comparison.

8. The method according to claim 7 wherein each of the four cells is written with a different data pattern.

9. A method for controlling banks of DRAM devices, each DRAM device containing a plurality of memory cells arrayed in rows and columns, each row and column having an individual row and column address, respectively, comprising the steps of:

determining which DRAM devices are present;

determining how dense each DRAM device is;

decoding an incoming address, specifying a cell of interest in each DRAM device in a bank, to designate the bank of DRAM devices each containing the cell of interest;

multiplexing the incoming address to generate a complete row address in accordance with the DRAM device density to specify the row in each DRAM device in the designated bank containing the cell of interest for the condition when each said DRAM device has an equal number of rows and columns and that simultaneously specifies the row containing the cell of interest for the condition when the DRAM device has an unequal number of rows and columns;

multiplexing the incoming address to generate a complete column address in accordance with the DRAM device density to specify the column in each DRAM device in the designated bank containing the cell of interest for the condition when each said DRAM device has an equal number of rows and columns, and to simultaneously specify the column containing the cell of interest for the condition when the DRAM device has an unequal number of rows and columns;

sequentially applying the complete row address and the complete column address to each DRAM device in the designated bank;

decoding only as much of the complete row address at each DRAM device as is necessary, in accordance with the number of rows in the DRAM device, to select the row containing the cell of interest; and decoding only as much of the complete column address at each DRAM device as is necessary, in accordance with the number of columns in the DRAM device, to select the column containing the cell of interest.

10. The method according to claim 9 wherein the step of determining the presence of the DRAM devices in each bank includes the steps of:

writing at least one data pattern into at least one cell known to exist in each possible DRAM device that may be present, the cell having an address which is the same regardless of whether the DRAM device is symmetric or asymmetric;

reading said one cell;

comparing the contents of said one cell to the data pattern written therein and generating a result indicative of such comparison, and indicating the presence of the DRAM device in accordance with the result of the comparison.

11. The method according to claim 9 wherein the step of determining the presence of the DRAM devices in each bank includes the steps of:

writing each of four separate data patterns into each of four cells, respectively, each cell known to exist in each possible DRAM device that may be present and each cell having an address which is the same irrespective of the DRAM device symmetry;

reading each cell;

comparing the contents of each cell to a separate one of the four data patterns and generating a result for each cell indicative of whether said separate data pattern is present in the cell; and indicating the presence of the DRAM device in accordance with the result of the comparison.

12. The method according to claim 9 wherein the step of determining the DRAM device density includes the steps of:

writing a data pattern into each of four cells whose addresses are separated by an amount corresponding to the possible variation in the density of the DRAM devices in the banks;

reading each of the four cells;

comparing the contents of each cell to the data pattern written therein and generating a result indicative of such comparison;

indicating the density of the DRAM device in accordance with the result of each comparison.

13. The method according to claim 12 wherein each of the four cells is written with a different data pattern.

14. An apparatus for controlling a plurality of banks of DRAM devices, each DRAM device comprised of a plurality of memory cells arrayed in rows and columns, each cell being uniquely identified by a row address and a column address, the method comprising the steps of:

means for decoding an incoming address, specifying a cell of interest in each DRAM device in a bank, to designate the bank of DRAM devices each containing the cell of interest;

means for multiplexing the incoming address to generate a complete row address that specifies the row in each DRAM device in the designated bank containing the cell of interest when each said DRAM device has an equal number of rows and columns, and that simultaneously specifies the row containing the cell of interest when the DRAM device has an unequal number of rows and columns, said means also multiplexing the incoming address to generate a complete column address that specifies the column in each DRAM device in the designated bank containing the cell of interest when each said DRAM device has an equal number of rows and columns, and that simultaneously specifies the column containing the cell of interest when DRAM device has an unequal number of rows and columns; and means for sequentially applying the complete row address and the complete column address to each DRAM device in the designated bank.

15. The apparatus according to claim 14 further including means for determining the presence and density of the DRAM devices in the banks.

16. The apparatus according to claim 15 wherein said means comprises:

address-generating means for generating at least one presence address that is valid for every possible DRAM device regardless of its density and for generating a plurality of size addresses, each separate from the other by an amount corresponding to DRAM device density differences; and data generator and comparison means generating at least one data pattern for writing to the presence and size addresses and comparing data read from said presence and size addresses to determine the DRAM device presence and density.

17. The apparatus according to claim 16 wherein said address-generating means comprises:

a first multiplexor for selectively passing at least one presence address;

a first buffer for temporarily storing the presence address passed by the first multiplexor;

a second multiplexor for selectively passing one of the four size addresses; and a second buffer for temporarily storing the size address passed by the second multiplexor.

18. The apparatus according to claim 16 wherein the data generator and comparator means comprises:

means for supplying at least one data pattern;

comparator means for comparing the data pattern supplied by said supplying means to a data pattern read from one of the size and presence addresses and for generating a result in accordance with said comparison;

register means for storing the results of said comparator means; and logic means for processing the results held by said register means.

* * * * *